US006169314B1

United States Patent
Wong et al.

(10) Patent No.: US 6,169,314 B1
(45) Date of Patent: Jan. 2, 2001

(54) LAYOUT PATTERN FOR IMPROVED MOS DEVICE MATCHING

(75) Inventors: Shyh-Chyi Wong, Taichung; Pin-Nan Tseng; Jyh-Kang Ting, both of Hsin-Chu, all of (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/345,358

(22) Filed: Jul. 1, 1999

Related U.S. Application Data

(62) Division of application No. 08/524,537, filed on Sep. 7, 1995.

(51) Int. Cl.[7] .......................... H01L 29/76; H01L 29/94; H01L 31/062; H01L 31/113; H01L 31/119
(52) U.S. Cl. ................................. 257/390; 257/401
(58) Field of Search .............................. 257/390, 401, 257/391

(56) References Cited

U.S. PATENT DOCUMENTS

| | | | |
|---|---|---|---|
| 5,610,429 | * | 3/1997 | Crafts . |
| 5,877,537 | * | 3/1999 | Aoki . |
| 5,952,698 | * | 9/1999 | Wong et al. . |
| 6,066,866 | * | 5/2000 | Omori . |
| 6,066,870 | * | 9/1999 | Siek . |
| 6,084,794 | * | 7/2000 | Lu et al. . |

OTHER PUBLICATIONS

"The Design of High–Performance Analog Circuits On Digital CMOS Chips" by E.A. Vittoz in IEEE Journal of Solid State Circuits, vol. SC–20, No. 3, Dec. '85, pp. 3–11.
"Measurement of MOS Current Mismatch in the Weak Inversion Region" vol. 29 No. 2, Feb. 1994, pp.138–142.

* cited by examiner

Primary Examiner—Sheila V. Clark
(74) Attorney, Agent, or Firm—George O. Saile; Stephen B. Ackerman; Larry J. Prescott

(57) ABSTRACT

This invention provides a circuit layout pattern and layout method for matching pairs of metal oxide semiconductor field effect transistors used in matched pairs in precision analog circuits. The layout uses dummy Metal oxide field effect transistors, or MOSFETs, to keep the environment the same around each of the MOSFETs in a matched pair. The MOSFETs in a matched pair are in a single row with each MOSFET in the matched pair having dummy MOSFETs adjacent to it on either side. The dummy MOSFETs can be part of the matched pair, can be used in other parts of the circuit, or may not be used. The use of dummy MOSFETs keeps the environment around each MOSFET in the matched pair the same and this improves the matching characteristics.

10 Claims, 10 Drawing Sheets

LAYOUT PATTERN FOR IMPROVED MOS DEVICE MATCHING

This is a division of patent application Ser. No. 08/524,537, filing date Sep. 7, 1995, Layout Pattern For Improved Mos Device Matching, assigned to the same assignee as the present invention.

BACKGROUND OF THE INVENTION (1) Field of the Invention

This invention provides a circuit layout pattern and layout method for matching pairs of metal oxide semiconductor field effect transistors used in matched pairs in precision analog circuits.

(2) Description of the Related Art ESCRIPTION OF THE RELATED ART

Matched pairs of transistors are important in precision analog circuits. There are conventional layout methods to design matched pairs in integrated circuit elements, such as cross-coupled metal oxide semiconductor field effect transistor layouts. These methods use a relatively large area of the integrated circuit element and do not handle short channel lengths of about 1.0 micrometer or less effectively.

The layout methods of this invention use a smaller area of the integrated circuit element and produce good matching results at channel lengths as low as 0.8 micrometers.

SUMMARY OF THE DISCLOSURE

Matching the parameters of metal oxide field effect transistors, or MOSFETs, is very important when the MOSFETs are used in critical analog circuits. FIG. 1 shows a conventional cross-coupled layout of four P channel metal oxide semiconductor field effect transistors, or PMOSFETs, in an integrated circuit element. The first, second, third, and fourth PMOSFETs are laid out in a rectangle as shown in FIG. 1. The first PMOSFET has a first channel diffusion area 100, a first gate electrode 103, and a first drain electrode 101, and a first source electrode 102. The second PMOSFET has a second channel diffusion area 110, a second gate electrode 113, and a second drain electrode 111, and a second source electrode 112. The third PMOSFET has a third channel diffusion area 120, a third gate electrode 123, and a third drain electrode 121, and a third source electrode 122. The fourth PMOSFET has a fourth channel diffusion area 130, a fourth gate electrode 133, and a fourth drain electrode 131, and a fourth source electrode 132. The first 100, second 110, third 120, and fourth 130 channel diffusion areas are rectangular each rectangle having two long sides and two short sides.

As shown in FIG. 1 the PMOSFETs are in a 2×2 array with the first PMOSFET and second PMOSFET in the first row, the third PMOSFET and fourth PMOSFET in the second row, the first PMOSFET and third PMOSFET in the first column, and the second PMOSFET and fourth PMOSFET in the second column. The long sides of the channel diffusion areas 100, 110, 120, and 130 lie on four parallel lines. The short sides of the channel diffusion areas 100, 110, 120, and 130 lie on four parallel lines which are perpendicular to the lines containing the long sides. FIG. 2 shows the sources of the four PMOSFETs connected together at a source node 17 for test purposes. The first PMOSFET 10 and the fourth PMOSFET 13 form a first transistor in the matched pair, and the second PMOSFET 11 and third PMOSFET 12 form a second transistor in the matched pair in the cross-coupled arrangement.

FIG. 3 shows the mismatching test results as a function of PMOSFET size, for channel widths between about 0.8 micrometers and 20 micrometers and channel lengths between about 0.65 micrometers and 4.0 micrometers, for cross-coupled PMOSFET arrays as described above and shown in FIGS. 1 and 2. The curves in FIG. 3 show the mean difference in threshold voltage 36 in millivolts, the standard deviation of the difference in threshold voltage 31, the mean difference of drain current factor 34 in percent, the standard deviation of the difference of drain current factor 35, the mean difference in drain current 33 in percent, and the standard deviation of the difference in drain current 32 all as a function of PMOSFET size. Drain current factor, B, is defined by the equation $I_d = \beta(V_g - V_t)^{60}$; where $I_d$ is the drain current, $V_g$ is the gate voltage, $V_t$ is the threshold voltage, and $\alpha$ is the velocity factor. The PMOSFET sizes are for a channel width of about 20 micrometers with channel lengths of 0.65, 0.9, 1.1, 1.6, 2.0, and 4.0 micrometers; a channel width of 1.6 micrometers with channel lengths of 0.65, 0.9, 1.1, and 1.6 micrometers; a channel width of 1.2 micrometers with a channel length of 0.9 micrometers; and a channel width of 0.8 micrometers with a channel length of 0.9 micrometers. As can be seen in FIG. 3 the mismatching increases as the channel width or channel length decreases.

It is a principle objective of this invention to provide a circuit layout of metal oxide semiconductor field effect transistors, or MOSFETs, which will provide improved matching of matched pairs of transistors used in analog circuits and extend to lower channel widths or channel lengths.

It is another principle objective of this invention to provide a method of matching of metal oxide semiconductor field effect transistors, or MOSFETS, for use as matched pairs in analog circuits and extend to lower channel widths or channel lengths.

These objectives are accomplished by using a circuit layout of MOSFETs which places a number of MOSFETs in a row in an integrated circuit element, such as that shown in FIG. 4. In this type of circuit layout there is a dummy MOSFET on either side of each MOSFET which is part of a matched pair of MOSFETs. The MOSFETs of the matched pair are adjacent to each other in the row. FIG. 4 shows a first MOSFET 401, a second MOSFET 402, a third MOSFET 403, and a fourth MOSFET 404 arranged in a row such that a line representing the direction of source to drain current flow of each MOSFET is parallel to the line representing the direction of source to drain current flow of the other transistors in the row. The dummy MOSFET can be a part of the matched pair, can be used for other purposes, or need not be used. The presence of the dummy MOSFETs on either side of each MOSFET in the matched pair provides significant improvement of the matching characteristics of the matched pair.

As an example refer to FIG. 4. If the second MOSFET 402 and the third MOSFET 403 make up the matched pair, the first MOSFET 401 and the third MOSFET 403 serve as the dummy MOSFETs for the second MOSFET 402, and the second MOSFET 402 and the fourth MOSFET 404 serve as the dummy MOSFETs for the third MOSFET 403. The second MOSFET 402 serves as a dummy MOSFET for the third MOSFET 403 even though it is part of the matched pair of MOSFETs.

DESCRIPTION OF THE PREFERRED EMBODIMENTS

Figure 1:
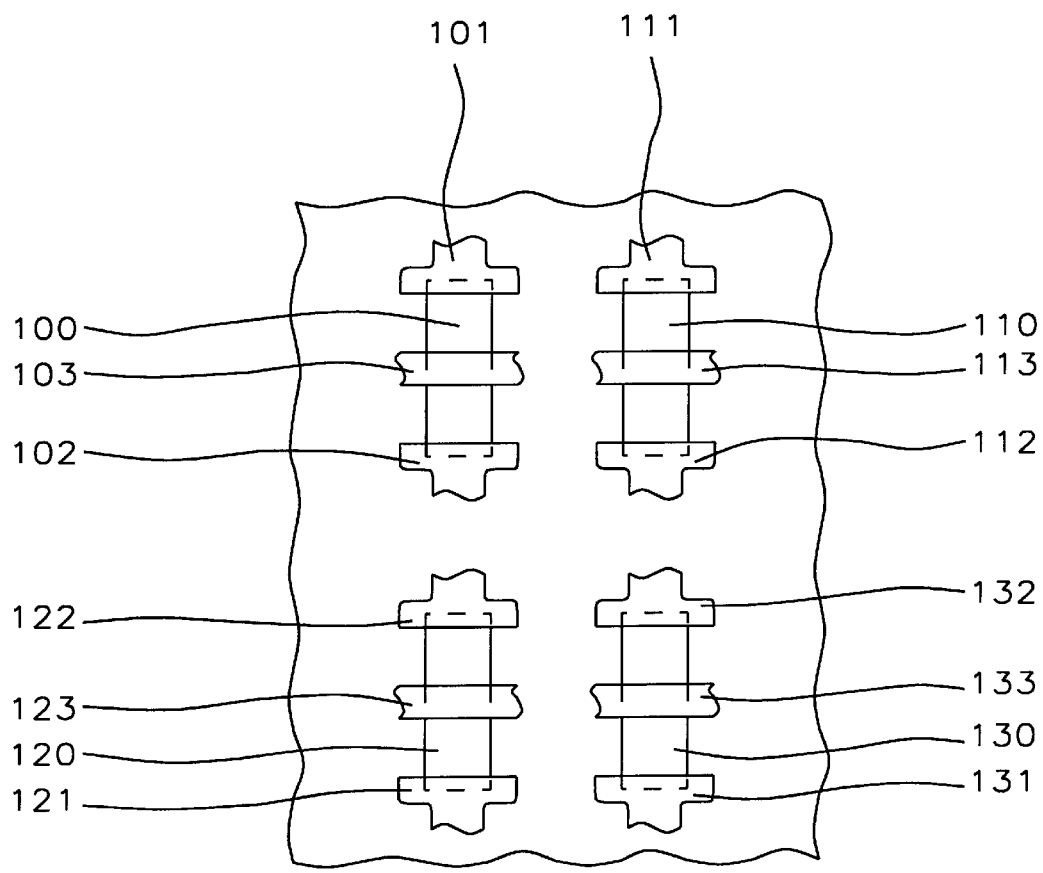
FIG. 1 is a conventional circuit layout for matching PMOSFETs in a conventional cross-coupled array.
Figure 2:
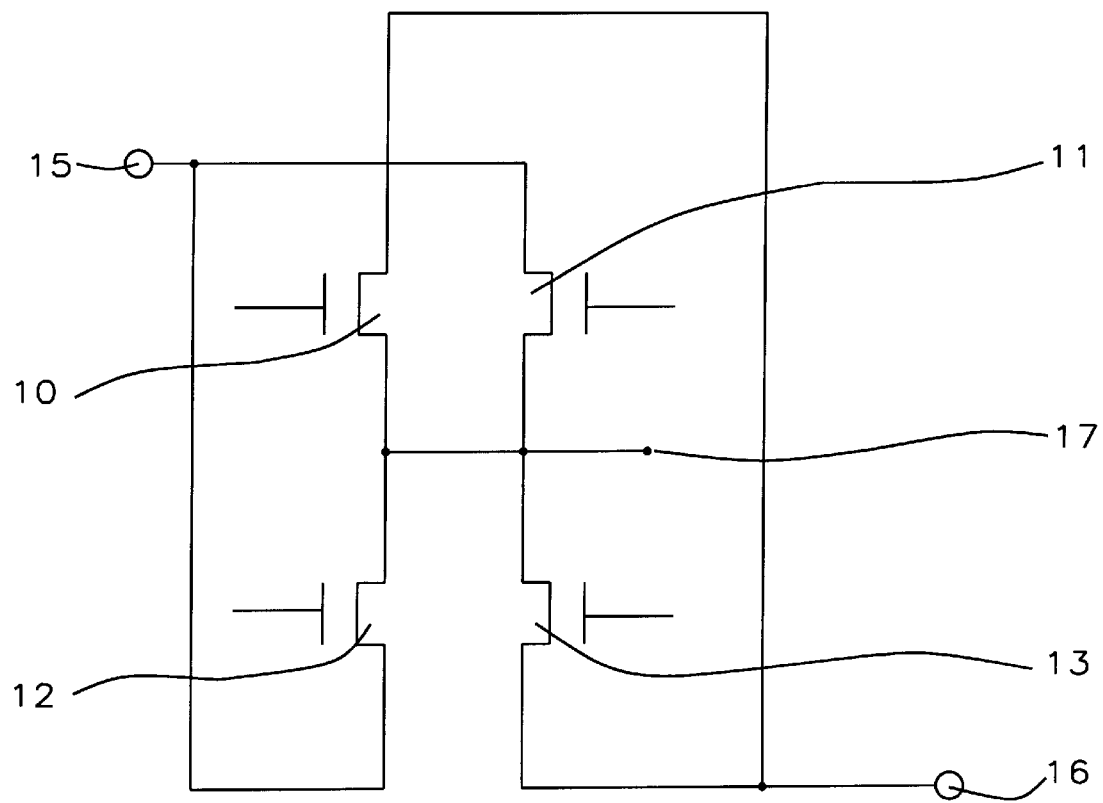
FIG. 2 is a schematic diagram of the circuit used to measure the matching characteristics of PMOSFETs in a conventional cross-coupled array.
Figure 3:
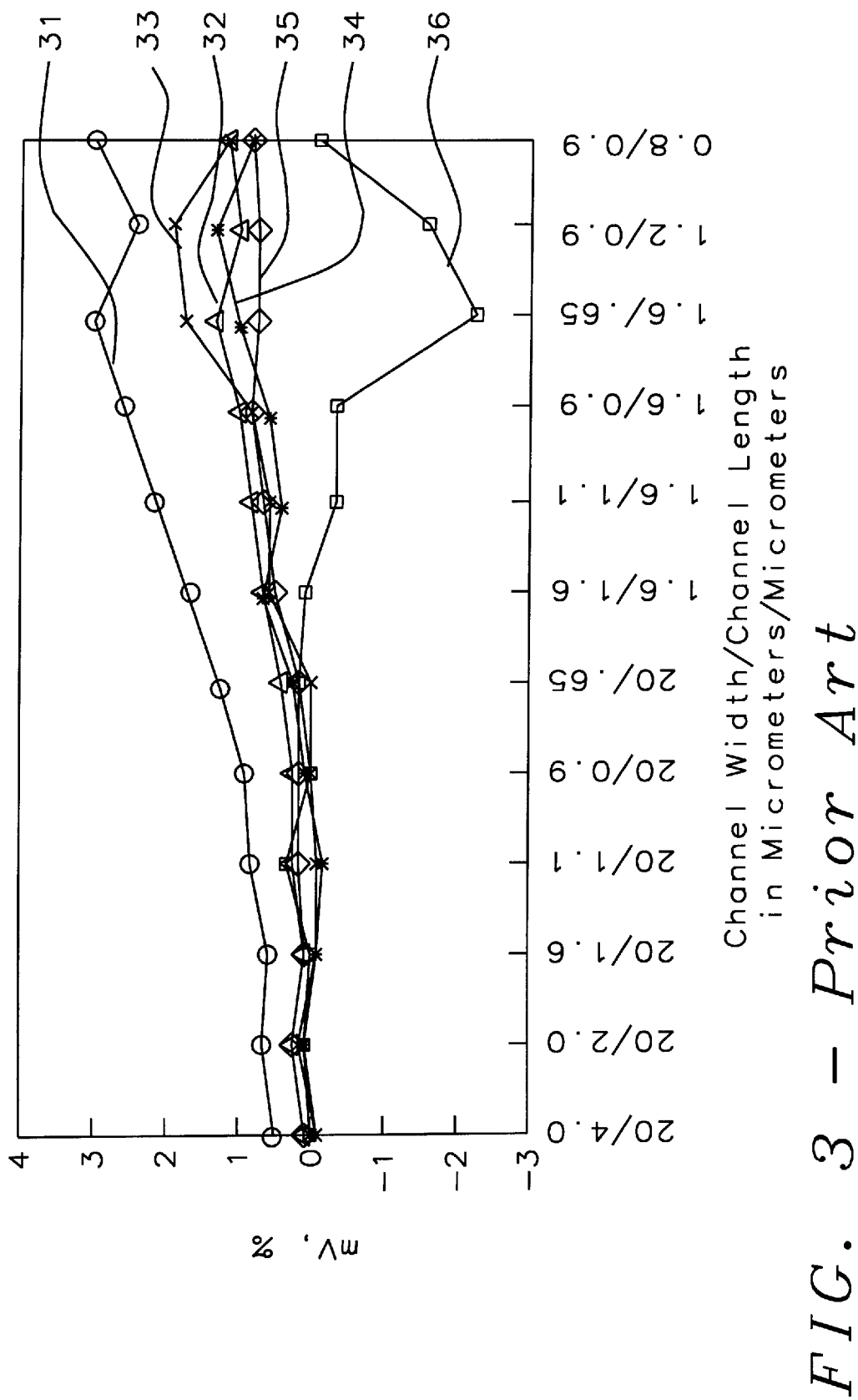
FIG. 3 shows the mismatching results of PMOSFETs in a conventional cross-coupled array.
Figure 4:
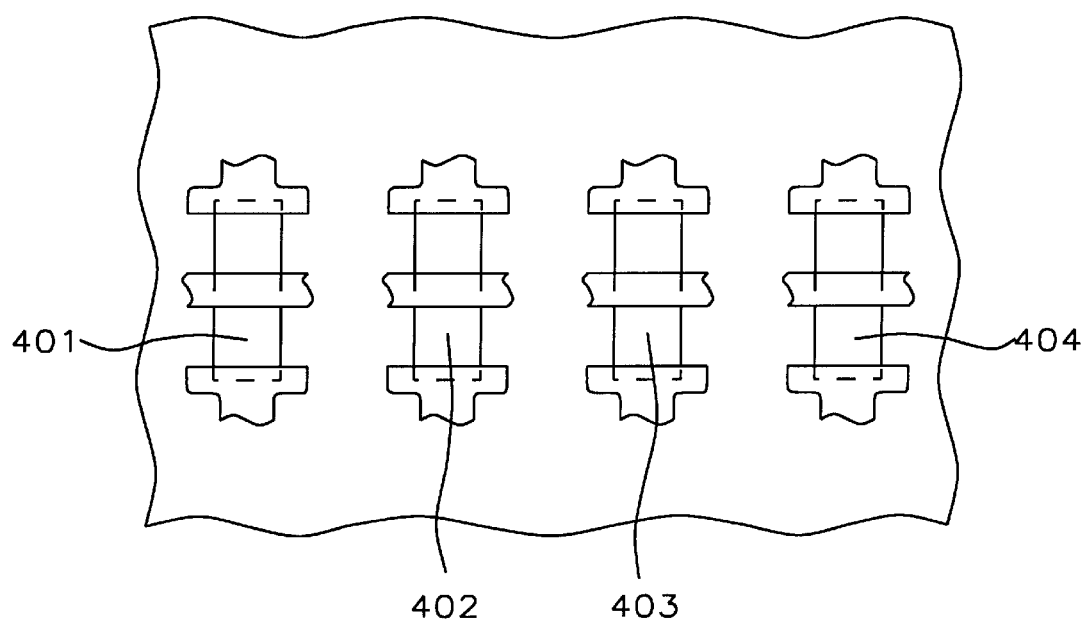
FIG. 4 shows a MOSFET device layout array for the array on analog product of this invention.
Figure 5:
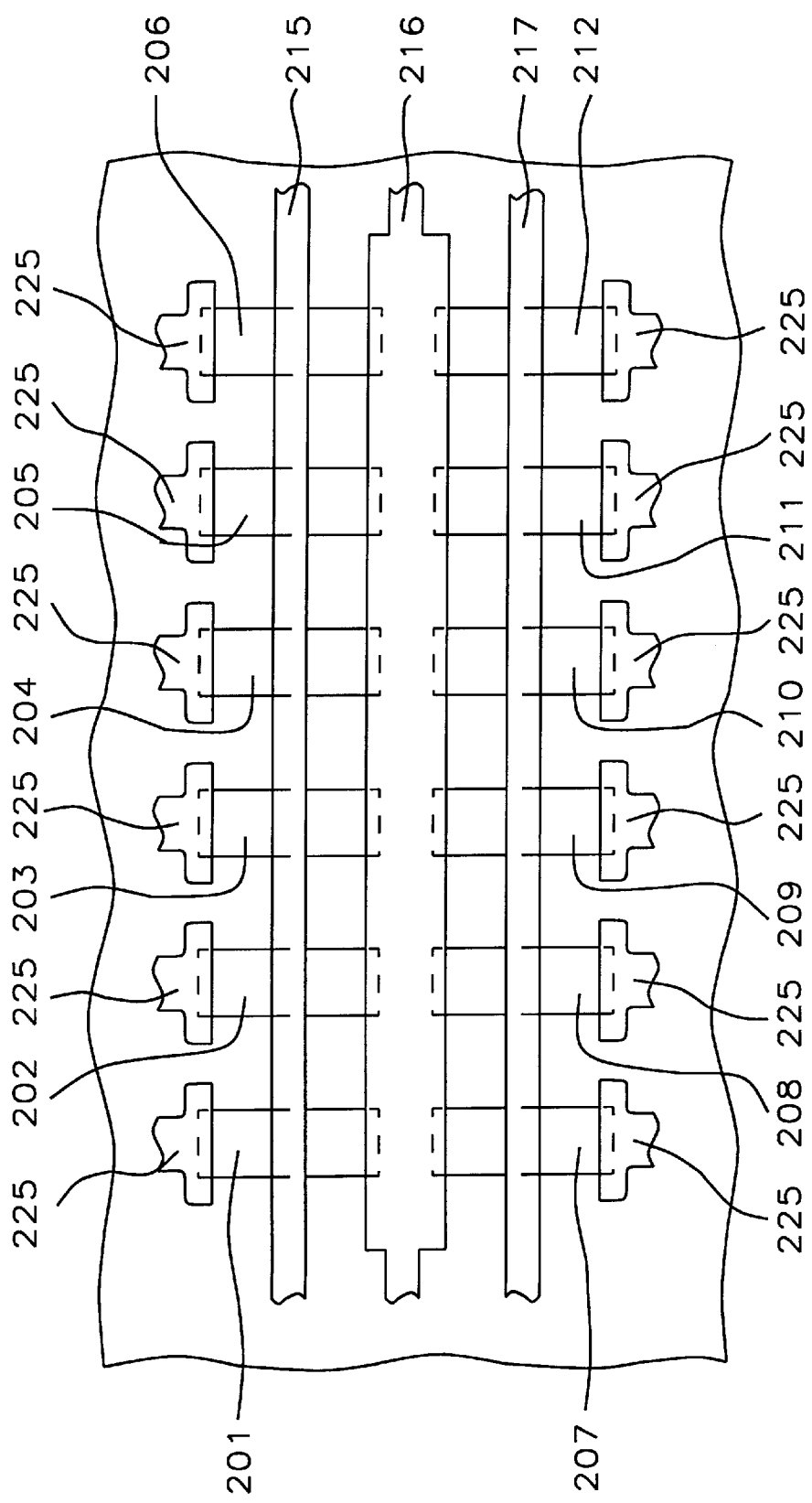
FIG. 5 shows a MOSFET device layout array for the in-line array of this invention using two lines of MOSFETs for testing mismatching parameters.
Figure 6:
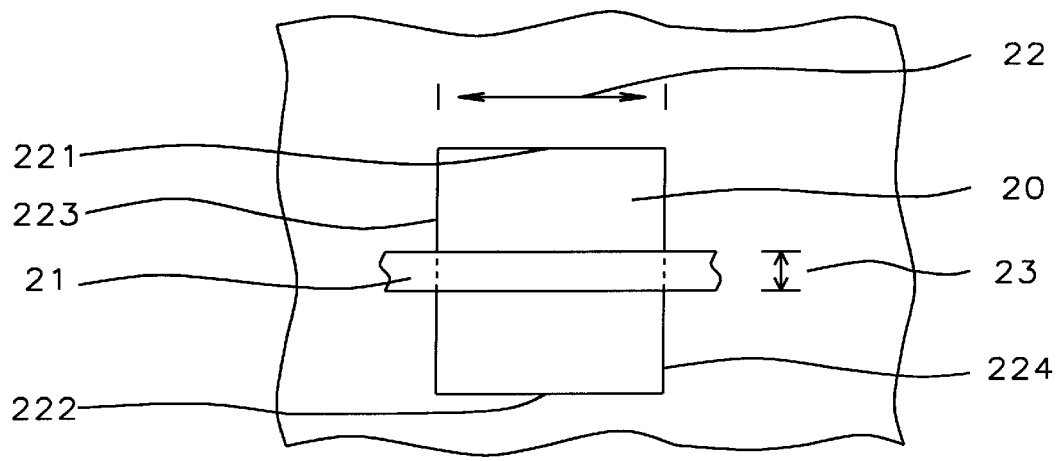
FIG. 6 shows a MOSFET device layout for a single device.

Refer now to FIGS. 4, 5, and 6, there is shown an embodiment of the MOSFET circuit layout array of this invention for MOSFET matching. FIG. 4 shows a first MOSFET 401, a second MOSFET 402, a third MOSFET 403, and a fourth MOSFET 404 arranged in an integrated circuit element in a row such that a line representing the direction of source to drain current flow of each MOSFET is parallel to the line representing the direction of source to drain current flow of the other transistors in the row. In this embodiment there is a dummy MOSFET on either side of the MOSFET which is part of the matched pair. The MOSFETs which make up the matched pair are adjacent to each other. The dummy MOSFET can be a part of the matched pair, can be used for other purposes, or need not be used. The presence of the dummy MOSFETs on either side of each MOSFET in the matched pair provides significant improvement of the matching characteristics of the matches pair.

As an example refer to FIG. 4. If the second MOSFET 402 and the third MOSFET 403 make up the matched pair, the first MOSFET 401 and the third MOSFET 403 serve as the dummy MOSFETs for the second MOSFET 402, and the second MOSFET 402 and the fourth MOSFET 404 serve as the dummy MOSFETs for the third MOSFET 403. The second MOSFET 402 serves as a dummy MOSFET for the third MOSFET 403 even though it is part of the matched pair of MOSFETs.

Refer now to FIG. 5, there is shown a circuit layout array of MOSFETs in an integrated circuit element used for evaluating MOSFET matching characteristics. There are twelve MOSFETs in the layout of this embodiment a first MOSFET 201, a second MOSFET 202, a third MOSFET 203, a fourth MOSFET 204, a fifth MOSFET 205, and a sixth MOSFET 206 in a first row of the array; and a seventh MOSFET 207, an eighth MOSFET 208, a ninth MOSFET 209, a tenth MOSFET 210, an eleventh MOSFET 211, and a twelfth MOSFET 212 in a second row of the array. A single source electrode 216 connects the source contacts of all the MOSFETs in the array. A first gate electrode 215 forms the gate for the first, second, third, fourth, fifth, and sixth MOSFETs. A second gate electrode 217 forms the gate for the seventh, eighth, ninth, tenth, eleventh, and twelfth MOSFETs. Each MOSFET has an identical drain electrode 225 connected to the drain contact. Each MOSFET has an identical rectangular channel diffusion area.

The rectangular diffusion area 20 is shown in FIG. 6. Each rectangular diffusion area 20 has a width 22, a top edge 221, a bottom edge 222, an inside edge 223, and an outside edge 224. The inside edges 223 and the outside edges 224 of the MOSFETs in the first row of the array are all parallel to each other as are the inside edges 223 and the outside edges 224 of the second row of the array. The top edges 221 of the MOSFETs in the first row of the array are co-linear, the bottom edges 222 of the MOSFETs in the first row of the array are co-linear, the top edges 221 of the MOSFETs in the second row of the array are co-linear, and the bottom edges 222 of the MOSFETs in the second row of the array are co-linear. The top edges 221 of the MOSFETs in the first row of the array, the bottom edges 222 of the MOSFETs in the first row of the array, the top edges 221 of the MOSFETs in the second row of the array, and the bottom edges 222 of the MOSFETs in the second row of the array lie on parallel lines.

The inside edges 223 of the first and seventh MOSFET are co-linear, the outside edges 224 of the first and seventh MOSFET are co-linear, the inside edges 223 of the second and eighth MOSFET are co-linear, the outside edges 224 of the second and eighth MOSFET are co-linear, the inside edges 223 of the third and ninth MOSFET are co-linear, the outside edges 224 of the third and ninth MOSFET are co-linear, the inside edges 223 of the fourth and tenth MOSFET are co-linear, the outside edges 224 of the fourth and tenth MOSFET are co-linear, the inside edges 223 of the fifth and eleventh MOSFET are co-linear, the outside edges 224 of the fifth and eleventh MOSFET are co-linear, the inside edges 223 of the sixth and twelfth MOSFET are co-linear, and the outside edges 224 of the sixth and twelfth MOSFET are co-linear. The top edges 221 and bottom edges 222 are perpendicular to the inside edges 223 and the outside edges 224.

FIG. 6 shows a section of the gate electrode 21 crossing the rectangular channel diffusion area 20. The width of the channel 22 is determined by the width of the rectangular channel diffusion area 20. The length of the channel is determined by the width 23 of the gate electrode 21.

Figure 7:
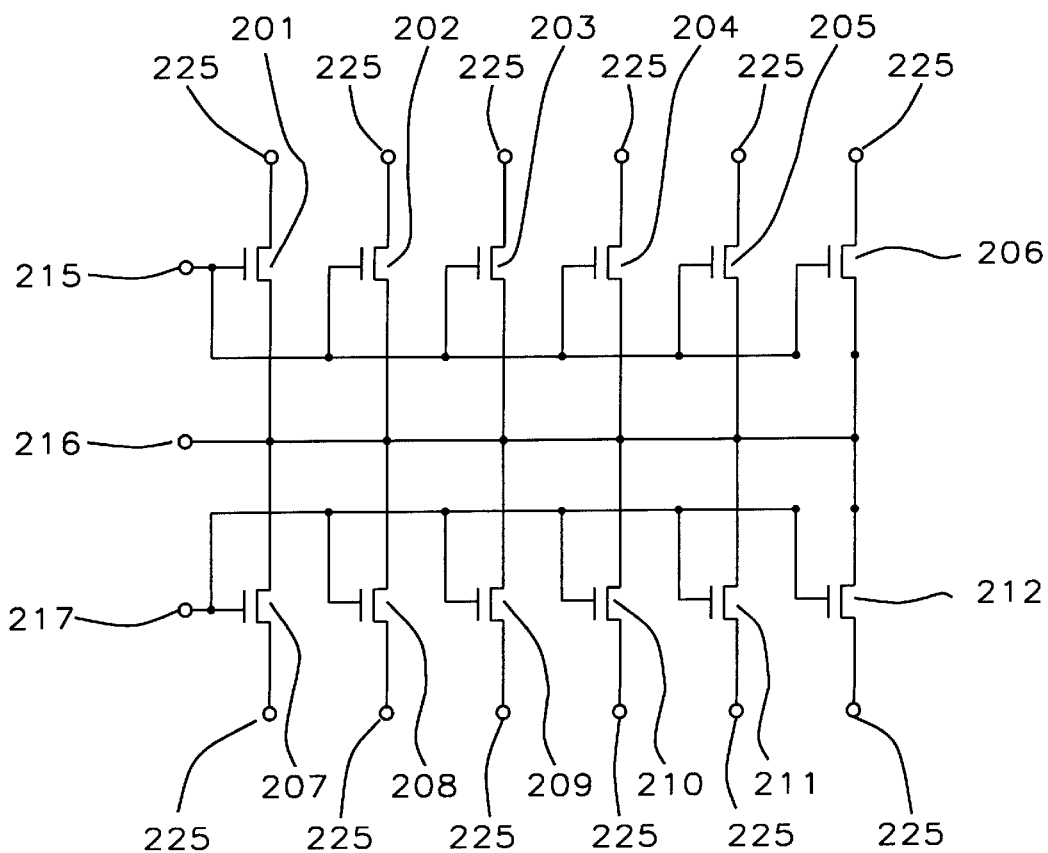
FIG. 7 shows a schematic circuit diagram corresponding to the device layout array of FIG. 5.

FIG. 7 shows a schematic diagram of the circuit layout of FIG. 5. The first 201, second 202, third 203, fourth 204, fifth 205, and sixth 206 MOSFETs are in the first row and the seventh 207, eighth 208, ninth 209, tenth 210, eleventh 211, and twelfth 212 MOSFETs are in the second row. The sources of all MOSFETs are connected to a source terminal 216, the gates of the top row of MOSFETs are connected to a first gate terminal 215, and the gates of the MOSFETs in the second row are connected to a second gate terminal 217. The drain connections of each MOSFET are connected to separate terminals 225.

In order to be part of a matched pair of MOSFETs a MOSFET must have a dummy MOSFET adjacent to the inside edge of its channel diffusion area, a dummy MOSFET adjacent to the outside edge of its channel diffusion area, and be adjacent to the other MOSFET in the matched pair. Referring again to FIG. 5, the second and third MOSFETs can form a matched pair as can the eighth and ninth MOSFETs but the first and second MOSFETs cannot. The dummy MOSFET makes the environment around both MOSFETs of the matched pair nearly identical and thereby improves the matching characteristics of the pair.

Figure 8:
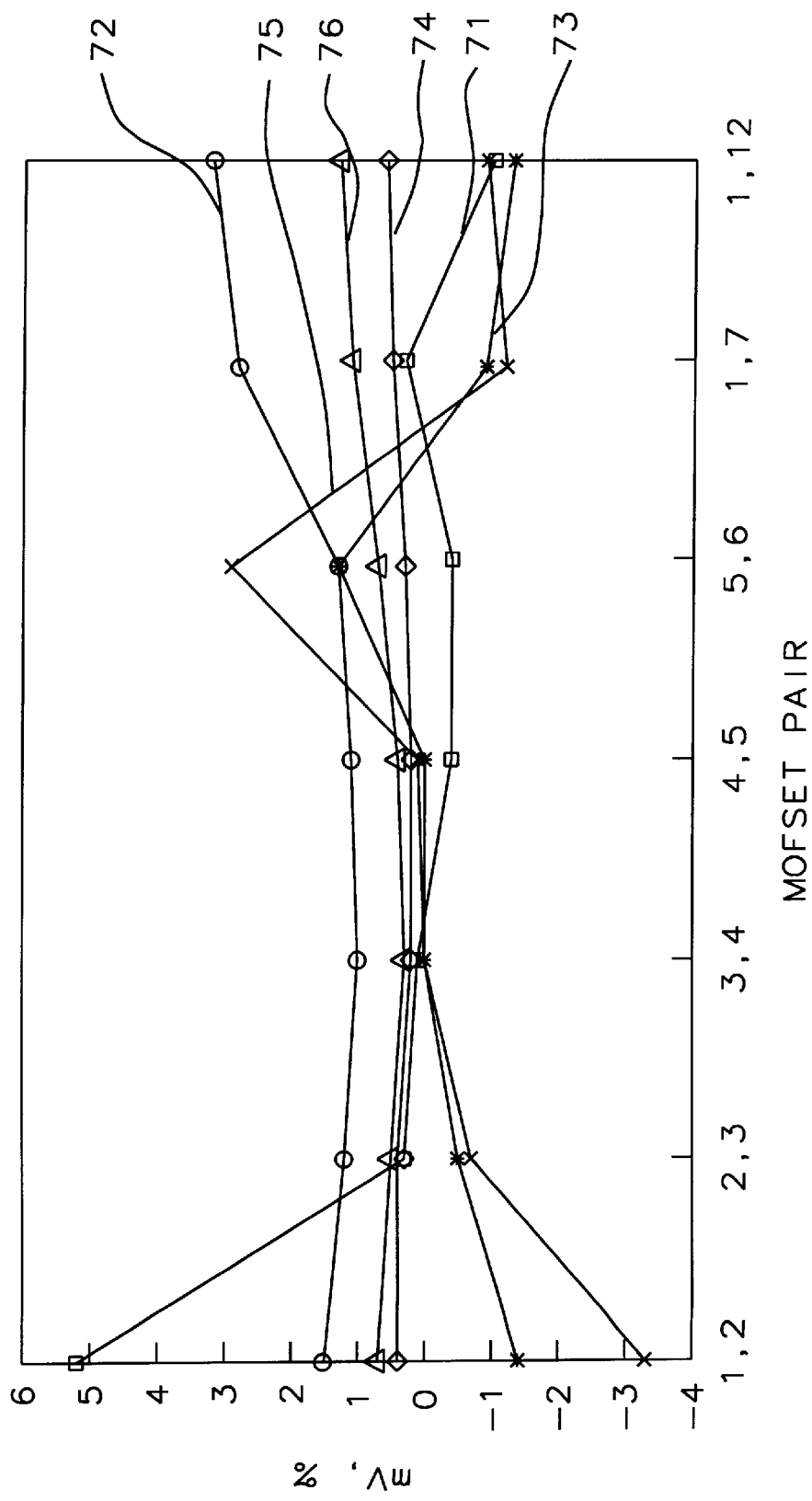
FIG. 8 shows the results of mismatching parameter measurements for the in-line array of this invention using MOSFETs with channel width of 20 micrometers and a channel length of 0.8 micrometers.

Refer now to FIG. 8, there is shown the mismatching results of twelve N channel MOSFETs with a channel width of 20 micrometers and a channel length of 0.8 micrometers made according to the circuit layout of FIGS. 5 and 7. The curves show the mean difference in threshold voltage in millivolts between MOSFETs in the pair 71, the standard deviation of the difference in threshold voltage between MOSFETs in the pair 72, the mean of the difference in drain current factor between MOSFETs in the pair 73, the standard deviation of difference in drain current factor between MOSFETs in the pair 74, the mean difference in drain current in percent between MOSFETs in the pair 75, and the standard deviation of the difference in drain current between MOSFETs in the pair 76 all as a function of MOSFET pair. As can be seen from FIG. 8 the mismatching results of pairs of MOSFETs which meet the matched pair criteria of a dummy MOSFET on either side of each MOSFET in the pair; second and third MOSFETs, third and fourth MOSFETs, and fourth and fifth MOSFETs are very good. The mismatching results of the pairs of MOSFETs where one of the MOSFETs in the pair is not adjacent to a dummy MOSFET; first and second MOSFETs, fifth and sixth MOSFETS, first and seventh MOSFETs, and first and twelfth MOSFETs have less desirable results.

Figure 9:
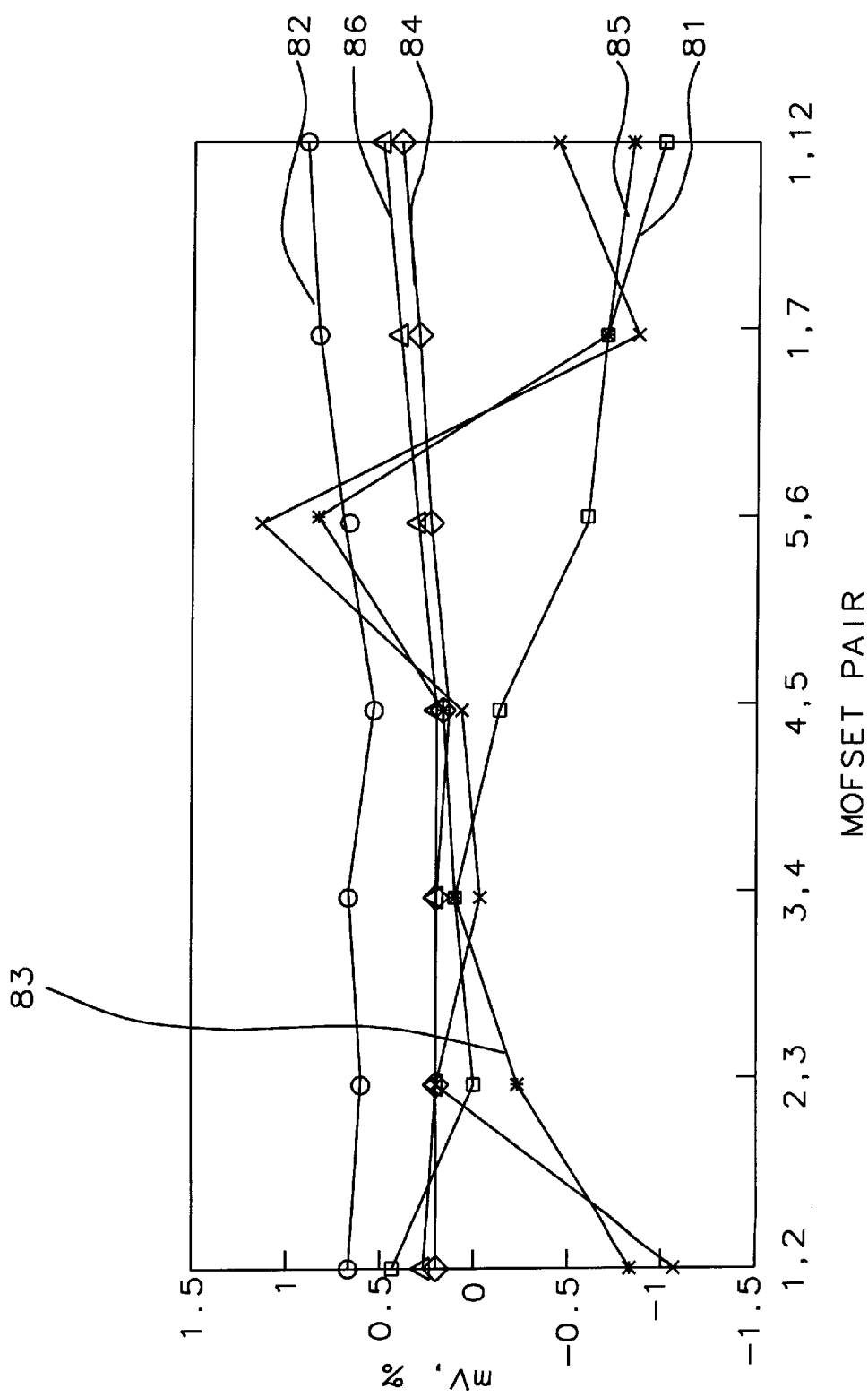
FIG. 9 shows the results of mismatching parameter measurements for the in-line array of this invention using MOSFETs with channel width of 20 micrometers and a channel length of 2.0 micrometers.

Refer now to FIG. 9, there is shown the mismatching results of twelve N channel MOSFETs with a channel width of 20 micrometers and a channel length of 2.0 micrometers made according to the circuit layout of FIGS. 5 and 7. The curves show the mean difference in threshold voltage in millivolts between MOSFETs in the pair 81, the standard deviation of the difference in threshold voltage between MOSFETs in the pair 82, the difference in drain current factor between MOSFETs in the pair 83, the standard deviation of the difference in drain current factor between MOSFETs in the pair 84, the mean difference in drain current in percent between MOSFETs in the pair 85, and the standard deviation of the difference in drain current between MOSFETs in the pair 876 all as a function of MOSFET pair. As can be seen from FIG. 9 the mismatching results of pairs of MOSFETs which meet the matched pair criteria of a dummy MOSFET on either side of each MOSFET in the pair; second and third MOSFETs, third and fourth MOSFETs, and fourth and fifth MOSFETs are very good. The mismatching results of the pairs of MOSFETs where one of the MOSFETs in the pair is not adjacent to a dummy MOSFET; first and second MOSFETs, fifth and sixth MOSFETs, first and seventh MOSFETs, and first and twelfth MOSFETs have less desirable results.

The results shown in FIGS. 8 and 9 show that the matched pairs of this invention produce good matching results over a wide range of channel width to channel length ratios. The use of dummy MOSFET's make it possible to use short channel devices, as low as 0.65 micrometers, in matched pairs. These layout methods also use less integrated circuit element area. The results shown in FIGS. 8 and 9 also show that the matched pairs of this invention produce much better matching results than the conventional methods of forming matched pairs.

Figure 10:
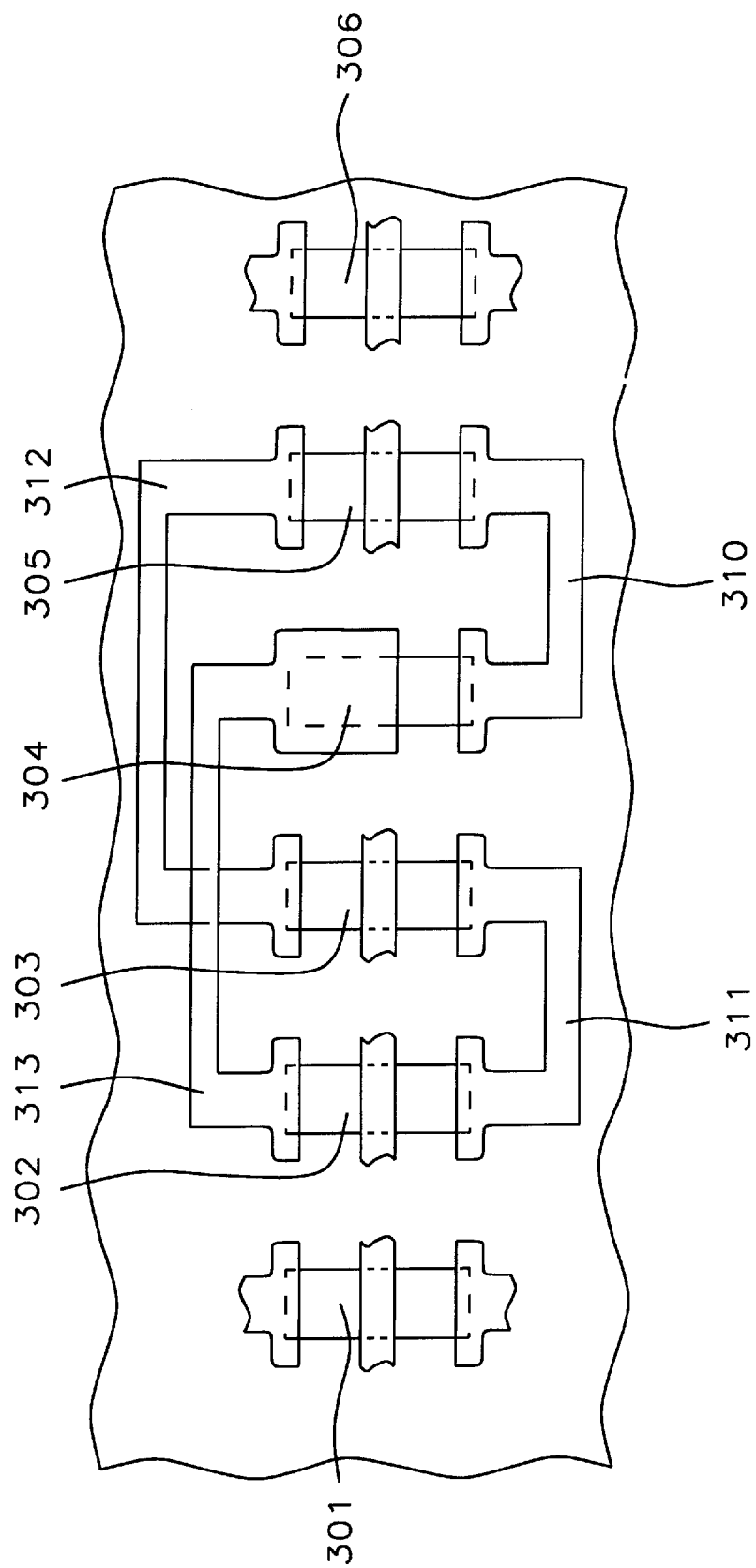
FIG. 10 shows a circuit layout of MOSFETs using the in-line array of this invention for an analog circuit.
Figure 11:
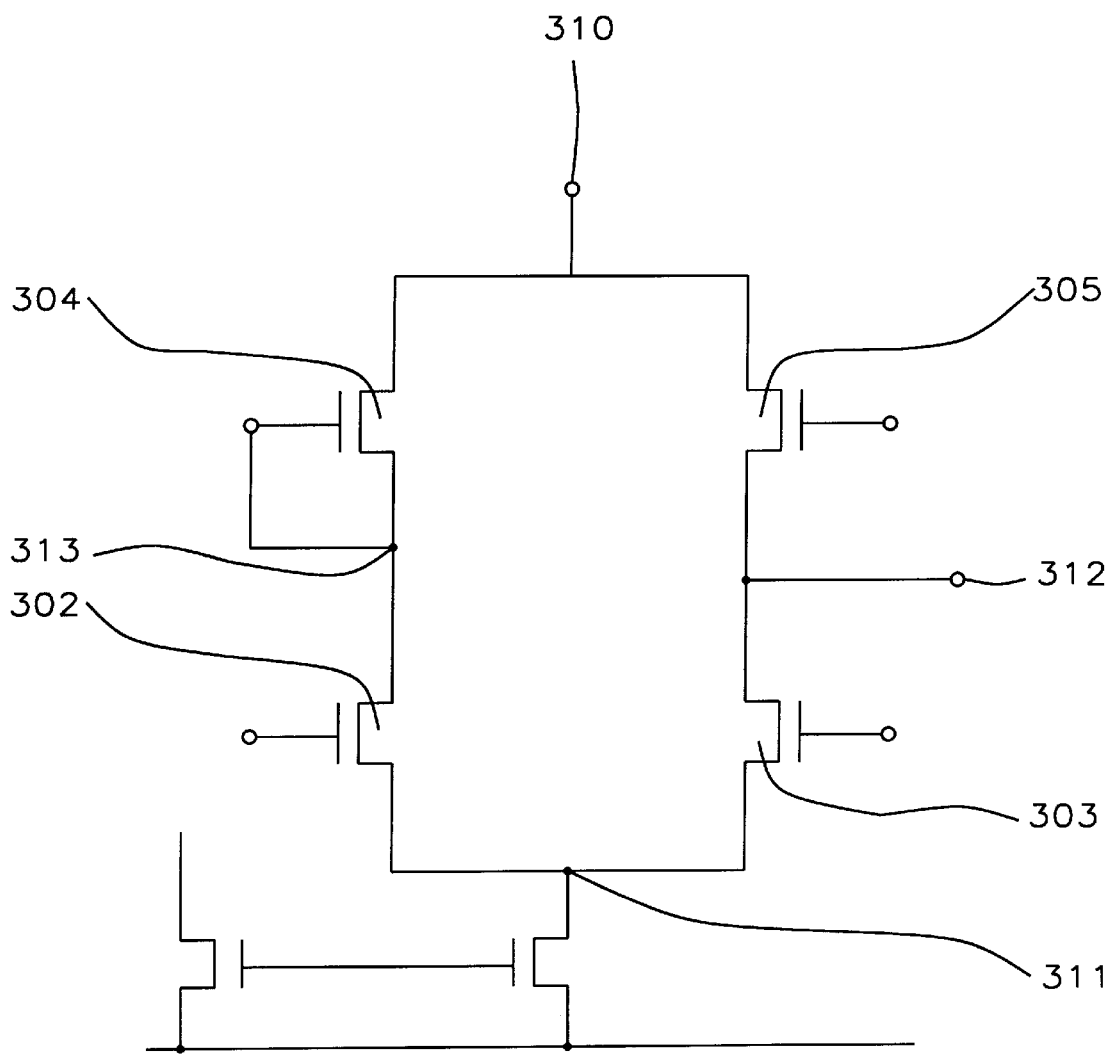
FIG. 11 shows a schematic diagram of the analog circuit of FIG. 10.

Refer now to FIGS. 10 and 11. The circuit layout of FIG. 10 can be used to form the analog circuit of FIG. 11. As shown in FIG. 10, the first 301, second 302, third 303, fourth 304, fifth 305, and sixth 306 MOSFETs are in a single row in the integrated circuit element. A first matched pair is formed from the second 302 and third 303 MOSFETs and a second matched pair is formed from the fourth 304 and fifth 305 MOSFETS. The first 301 MOSFET serves as a dummy MOSFET for the second MOSFET and -the sixth 306 MOSFET serves as a dummy for the fifth 305 MOSFET. FIG. 11 shows a schematic diagram where the matched pairs are used in an analog circuit, the second 302 and third 303 MOSFETs forming a first matched pair and the fourth 304 and fifth 305 MOSFETs forming a second matched pair. The interconnection 310 between the fourth 304 and fifth 305 MOSFETs, the interconnection 311 between the second 302 and third 303 MOSFETs, the interconnection 312 between the third 303 and fifth 305 MOSFETs, and the interconnection 313 between the second 302 and fourth 304 MOSFETs are shown in FIGS. 10 and 11.

While the invention has been particularly shown and described with reference to the preferred embodiments thereof, it will be understood by those skilled in the art that various changes in form and details may be made without departing from the spirit and scope of the invention.

What is claimed is:

1. A circuit layout, comprising:

a number of metal oxide semiconductor field effect transistors each said transistor having a rectangular channel diffusion area bounded by a top edge, a bottom edge, an inside edge, and an outside edge wherein said transistors are arranged in a row so that said inside edge of each channel diffusion area is parallel to said inside edges of the remaining said channel diffusion areas, said outside edge of each channel diffusion area is parallel to said outside edges of the remaining said channel diffusion areas, said inside edge of each said channel diffusion area is parallel to said outside edge of each said channel diffusion area, said top edge of each said channel diffusion area is parallel to said bottom edge of each said channel diffusion area, said top edge of each said channel diffusion areas are perpendicular to said inside edge and said outside edge of each said channel diffusion area, said top edges of each said channel diffusion area lie on a single line, and said bottom edges of each said channel diffusion area lie on a single line;

a number of gate electrodes equal to the number of said transistors wherein one of each said gate electrodes crosses each said channel diffusion area so that the edges of said gate electrodes are parallel to said top edge of said channel diffusion area;

a source contact at each said channel diffusion area;

a drain contact at each said channel diffusion area;

a number of matched pairs of said transistors; and electrode connections to interconnect said transistors such that each said transistor forming one of said matched pairs has one of said transistors adjacent to said inside edge of said channel diffusion area of said transistor forming said matched pair and one of said transistors adjacent to said outside edge of said channel diffusion area of said transistor forming said matched pair.

2. The circuit layout of claim 1 wherein each of said transistors forming one said matched pair of transistors is adjacent to the other said transistor forming said matched pair of transistors.

3. The circuit layout of claim 1 wherein said number of metal oxide semiconductor field effect transistors is six.

4. The circuit layout of claim 1 wherein said number of matched pairs is two.

5. The circuit layout of claim 1 wherein each said rectangular channel diffusion area has a channel width and a channel length.

6. The circuit layout of claim 5 wherein said channel width is about 20 micrometers.

7. The circuit layout of claim 5 wherein said channel length is about 0.8 micrometers.

8. The circuit layout of claim 1 wherein each said top edge and each said bottom edge of each said rectangular channel diffusion area is between about 1 and 100 micrometers.

9. The circuit layout of claim 1 wherein each said inside edge and each said outside edge of each said rectangular channel diffusion area is between about 0.2 and 5 micrometers.

10. The circuit layout of claim 1 wherein the distance between said rectangular channel diffusion areas of adjacent said metal oxide semiconductor field effect transistors is between about 0.3 and 4 micrometers.

* * * * *